US005512098A

United States Patent [19]

French et al.

[11] Patent Number: 5,512,098

[45] Date of Patent: Apr. 30, 1996

[54] APPARATUS FOR IMPREGNATING WOOD

[75] Inventors: Nicholas A. French, Douglas, Mich.; W. Dale Ellis, McFarland; Roger M. Rowell, Madison, both of Wis.

[73] Assignees: Hawworth, Inc., Holland, Mich.; The United States of America, as represented by the Secretary of Agriculture, Washington, D.C.

[21] Appl. No.: 284,806

[22] Filed: Aug. 2, 1994

[51] Int. Cl.$^{6}$ .......................... C23C 14/24; C23C 14/50; B05C 3/109; B05C 13/02

[52] U.S. Cl. ............................ 118/50; 118/423; 118/428; 118/429; 118/503; 118/56; 427/297; 427/440

[58] Field of Search .................................... 118/423, 503, 118/50, 56, 428, 429, 425; 427/297, 298, 359, 365, 440, 441; 134/135, 164, 165

[56] References Cited

U.S. PATENT DOCUMENTS

| | | | |
|---|---|---|---|
| 2,559,286 | 7/1951 | Downes | 427/440 X |
| 3,551,190 | 12/1970 | Myers | 118/50 X |
| 3,645,231 | 2/1972 | Barrett | 118/429 X |
| 3,759,217 | 9/1973 | Wiegmann | 118/50 X |
| 3,801,360 | 4/1974 | Dahlgren | 118/50 X |
| 4,233,929 | 11/1980 | Hurst et al. | 118/50 |
| 4,286,540 | 9/1981 | Bernath | 118/425 X |
| 4,407,229 | 10/1983 | Sanborn | 118/425 X |
| 4,453,491 | 6/1984 | Hite et al. | 118/503 X |
| 4,527,508 | 7/1985 | Juve | 118/425 |
| 4,637,952 | 1/1987 | Rosenlund | 118/429 X |
| 4,892,758 | 1/1990 | Serbiak et al. | 427/365 X |
| 4,895,101 | 1/1990 | Knorr | 118/423 X |

*Primary Examiner*—Robert J. Warden
*Assistant Examiner*—E. Leigh Dawson
*Attorney, Agent, or Firm*—Flynn, Thiel, Boutell & Tanis

[57] ABSTRACT

Apparatus for impregnating wood veneer with a liquid impregnant comprises a container having an upper chamber communicated to a lower impregnation chamber. A clamping mechanism is releasably engageable to a peripheral region of the wood veneer and is cooperably received in the upper chamber in a manner to suspend the wood veneer in the impregnation chamber. An elevator overlies the container and is releasably connectable to the clamping mechanism for lowering the clamping mechanism into the upper chamber to suspend the wood veneer in the impregnation chamber therebelow. The clamping mechanism is disconnected from the elevator such that the clamping mechanism remains in the upper chamber during impregnation of the wood veneer with liquid impregnant. The impregnation chamber is evacuated by a vacuum pump after the wood veneer is suspended therein, and liquid impregnant is introduced from a storage tank to the impregnation chamber about the wood veneer. A venting valve is openable to establish ambient pressure in the impregnation chamber to impregnate the wood veneer with the liquid impregnant therein. Following impregnation, the clamping mechanism is reconnected to the elevator to enable removal of the impregnated wood veneer from the container.

10 Claims, 6 Drawing Sheets

APPARATUS FOR IMPREGNATING WOOD

FIELD OF THE INVENTION

The present invention relates to apparatus for impregnating wood, especially wood veneer, with polymerizable liquid impregnant to improve its hardness, especially its resistance to indentation and scratching when in use as office furniture.

BACKGROUND OF THE INVENTION

Wood veneered office furniture is in widespread use in the modern office environment. Such office furniture is advantageous in that the wood veneer provides the aesthetic appearance of solid wood without its high cost. Natural wood veneers currently used in the manufacture of office and other furniture comprise thin, narrow sheets or strips (referred to as fletches) of natural wood laid side-by-side and adhesively bonded together to form larger sized veneer sheets that can be cut to desired size/shape and adhered to a suitable furniture substrate material, such as particle board. An alternative to natural veneer referred to as reconstituted veneer also is formed as a veneer sheet that can be cut to size/shape and adhered to a suitable furniture substrate material. Importantly, natural and reconstituted veneers are amenable to staining and other conventional furniture finishing operations employed to fabricate finished furniture products so that the wood veneer will aesthetically match any solid wood trim of like wood species included on the furniture and any solid wood furniture of like wood species, such as for example, solid wood chairs, that may be encountered in an office environment.

Wood veneered office furniture, such as, for example, a desk, work table, credenza, and the like, includes a flat, horizontal writing surface at which day-to-day office activities are conducted. Unfortunately, wood veneer office furniture writing surfaces have been observed to suffer damage referred to as "read through" when the surfaces are subjected to typical hand writing pressure. This damage comprises permanent indentations and scratches in the wood veneer surface caused by the localized surface pressures exerted during the act of writing using a ball point pen, pencil or other pointed writing instrument.

Although the pressure exerted during writing varies with the individual writer, most people are estimated to exert about 0.33 to 2 pounds pressure in the process of writing. If an individual uses a fine point ball point pen with a ball diameter of approximately 0.3 millimeters and applies 2 pounds of writing pressure, an equivalent writing pressure (EWP) of approximately 13,900 pounds per square inch is exerted on the writing surface. If the individual uses a writing instrument having a larger point size and/or lower writing pressure, the EWP exerted on the writing surface will be reduced. For example, for an individual using a lead pencil having an approximate point size of 0.9 millimeters and a writing pressure of 1 pound, the EWP will be about 80 pounds per square inch. Thus, the wood veneer writing surfaces can be subjected in use to a wide range of writing pressures, some of which are unexpectedly high pressures per unit surface area.

The inability of wood veneer office furniture writing surfaces to withstand the writing pressures commonly encountered in use is attributable to the inherent softness of wood as well as to the anisotropic nature of wood hardness which is known to vary considerably from one wood species to another and, for the same wood species, in dependence on the ratio of latewood (grown in the summer and the early fall) to summerwood (grown in the spring), the ratio of heartwood to sapwood, extractives content, mineral content, and other factors. As a result, wood veneer typically exhibits a wide variability in hardness across its surface. For example, an oak veneer writing surface may exhibit a higher surface hardness at regions comprising the more dense latewood, and a lower surface hardness at regions comprising the less dense earlywood. The variability of wood veneer surface hardness is even greater in other species of wood. As a result, it has been noted that even writing pressures as low as 80 pounds per square inch can result in permanent indentations in most wood veneer writing surfaces; namely, at the softer regions of the wood where earlywood is present.

Although "read through" indentations do not adversely affect the overall structural integrity of wood veneered office furniture, they are perceived by users of the furniture as detracting from its appearance and indicating a lack of durability of the furniture. In particular, "read through" damage is perceived as the primary shortcoming associated with the use of wood veneered office furniture.

Copending patent application Ser. No. 08/089,707, filed Jul. 9, 1993, of common assignee herewith and entitled "Indentation Resistant Wood and Method of Producing Same For Furniture Use" describes manufacture of indentation resistant wood veneer and other wood products. Indentation resistant wood veneer is produced by impregnating the veneer with a suitable liquid monomeric impregnant and then hot pressing the impregnated veneer to polymerize the impregnant in-situ in the wood cells, pores, channels, lumens, etc. The resulting impregnated wood veneer overcomes the primary shortcoming of the natural and reconstituted wood veneers with respect to indentation resistance.

SUMMARY OF THE INVENTION

The present invention provides apparatus for impregnating a wood member, such as wood veneer, with a liquid impregnant wherein the apparatus comprises a container having an impregnation chamber for receiving the wood member to be impregnated and fixturing means for releasably engaging the wood member and adapted to be received in the container in cooperation therewith for suspending the wood member in the impregnation chamber. The fixturing means remains in the container during the impregnation operation. The apparatus further includes means for evacuating the impregnation chamber after the wood member is suspended therein, means for introducing liquid impregnant into the impregnation chamber about the suspended wood member, and means for establishing a pressure in the impregnation chamber effective to impregnate the suspended wood member with the liquid impregnant. After wood impregnation, the fixturing means is removed from the container to withdraw the impregnated wood member from the impregnation chamber.

In one embodiment of the invention, the fixturing means comprises a clamping mechanism for releasably engaging a peripheral end region of a wood member, such as a wood veneer sheet. The clamping mechanism is releasably connectable to an elevator that cooperably positions the clamping mechanism in the container to suspend the wood in the impregnation chamber. The clamping mechanism is disconnected from the elevator after the wood member is suspended in the impregnation chamber such that the clamping mechanism resides in the container during the impregnation operation.

In a particular embodiment of the invention, the container includes an upper chamber above and communicated to a lower impregnation chamber. The upper chamber and clamping mechanism are adapted to cooperably engage for positioning the wood member in impregnation chamber.

After impregnation of the wood member, the clamping mechanism is reconnected to the elevator for removal of the clamping mechanism and impregnated wood member clamped thereto from the container.

In another embodiment of the invention, wiping means is provided to wipe off excess liquid impregnant as the impregnated wood member is removed from the impregnation chamber. The wiping means may comprise a pair of wiper rollers disposed in the upper chamber to remove excess impregnant from an impregnated wood veneer sheet.

The apparatus of the invention is useful for impregnating wood veneer sheet with a liquid impregnant that penetrates inwardly into the wood veneer cells, pores, lumens, channels, etc. (i.e. wood voids) and subsequently is polymerizable to form in-situ a solid polymeric impregnant that improves veneer surface hardness and resistance to writing indentations.

The invention may be understood better when considered in light of the following detailed description of certain specific embodiments thereof which are set forth hereafter in conjunction with the following drawings.

DETAILED DESCRIPTION

FIGS. 1–6 illustrate apparatus in accordance with one embodiment of the invention for successively impregnating individual wood veneer sheets. The wood veneer sheets can comprise natural wood veneers and reconstituted wood veneers widely used in the manufacture of office and other furniture. The impregnated wood veneer sheets are each subsequently thermally treated to polymerize the impregnant and laminated to a suitable substrate to provide a hardened writing surface thereon that is resistant to writing indentations (i.e. "read-through") and scratching as explained in detail in copending, commonly assigned application Ser. No. 08/089,707 filed Jul. 9, 1993, the teachings of which are incorporated herein to this end.

As is well known, natural wood veneers are fabricated from thin, narrow veneer sheets or strips (referred to as fletches) of natural wood laid side-by-side and adhesively bonded together to form a larger sized veneer sheet (e.g. 2 feet in width, 5 feet in length, and 0.030 inch in thickness) that can be cut or trimmed to appropriate size/shape for the underlying furniture substrate to which the veneer will be bonded.

As is also well known, reconstituted veneer comprises obeche or like wood adhesively bonded together into a veneer sheet that also can be cut to appropriate size/shape for the furniture substrate to which the veneer will be bonded.

Figure 1:
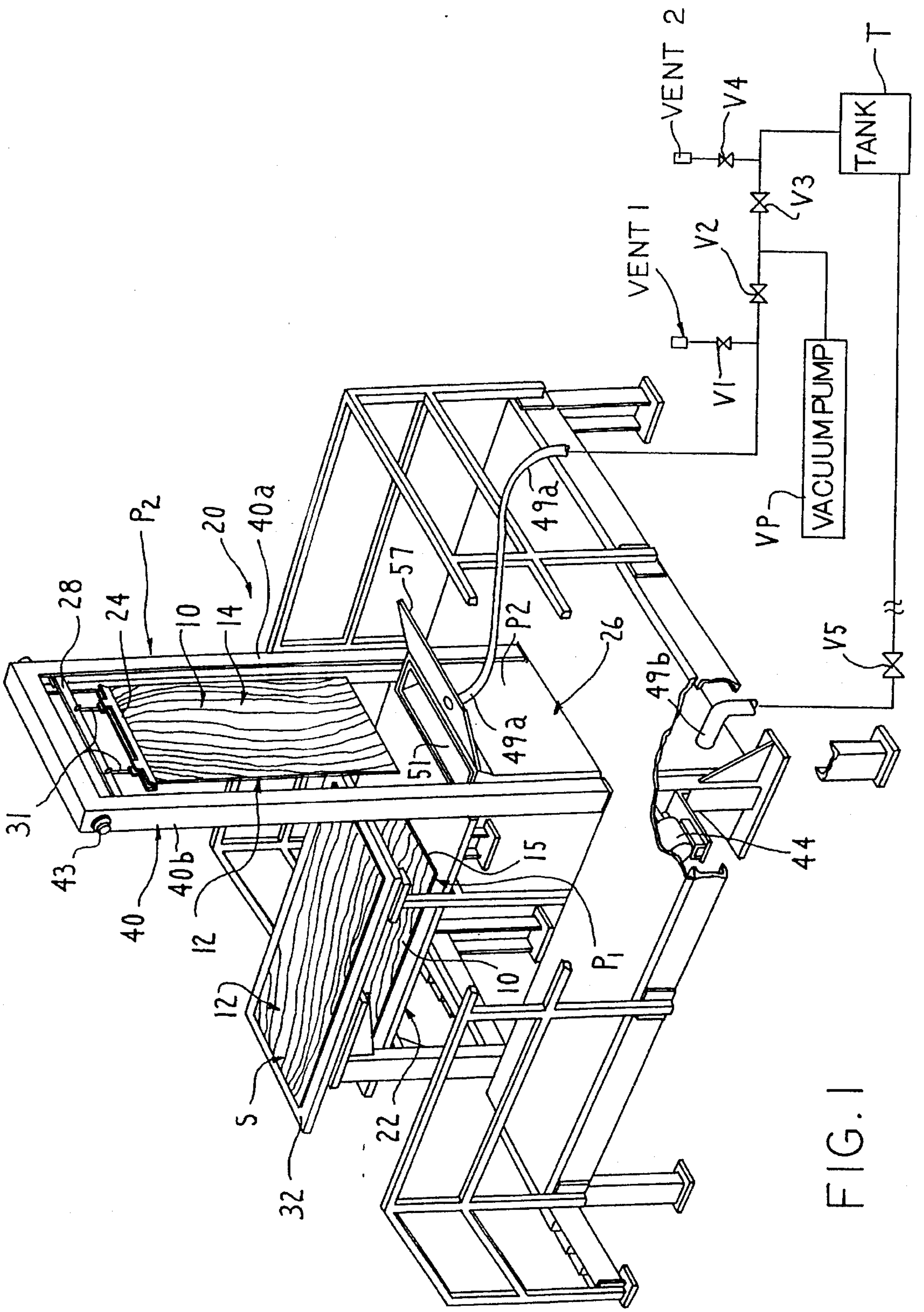
FIG. 1 is a perspective view of apparatus in accordance with one embodiment of the invention for impregnating a wood veneer sheet. The liquid impregnant transfer conduits, valves, etc. are shown schematically for convenience.
Figure 2:
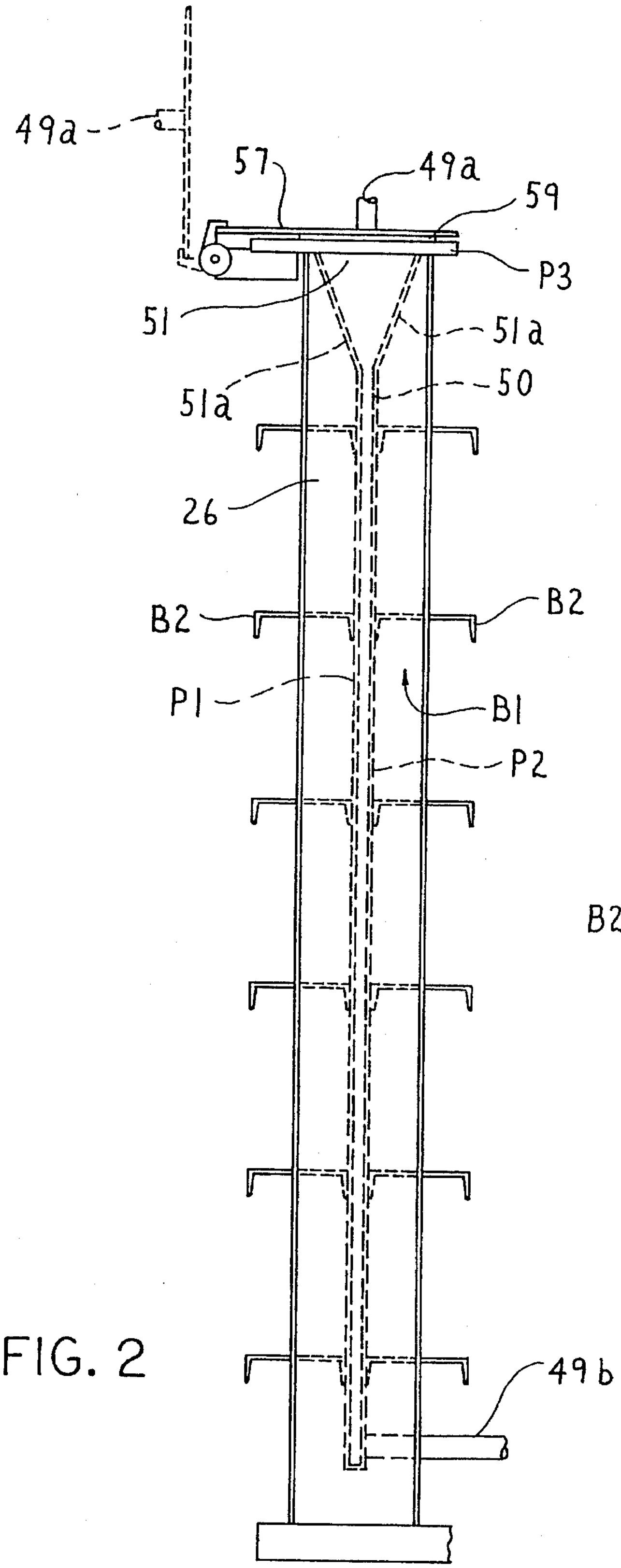
FIG. 2 is an elevational view of the treatment container.

Exemplary wood veneer sheets 10 for impregnation in accordance with one embodiment of the invention are shown in FIG. 1. Each veneer sheet includes major faces or surfaces 12, 14 on opposite sides thereof.

Preferably, the individual wood veneer sheets 10 exhibit a moisture content below about 20% prior to the vacuum/atmospheric impregnation step. The veneer sheets 10 can be dried, if necessary, prior to impregnation to this end.

The illustrative impregnation apparatus 20 of FIGS. 1–6 is adapted to impregnate in succession relatively large individual wood veneer sheets 10 of the size that would be used in the manufacture of office furniture, such as desks. To this end, the impregnation apparatus 20 comprises a stationary, lower shuttle table 22 on which a plurality of untreated wood veneer sheets 10 are stacked (only one sheet 10 shown) prior to impregnation. To effect impregnation of individual veneer sheets 10, an inner peripheral end or edge region 15 of each veneer sheet 10 is successively clamped to a vertically movable clamping mechanism (clamping head) 24 and movable from the horizontal position $P_1$ to the vertical position $P_2$ above a treatment container 26 as shown in FIG. 1. As shown best in FIGS. 3–4 and 6, the clamping mechanism 24 comprises first and second elongated, opposing sheet metal clamp members or jaws 25 having respective first and second pairs of opposing actuating members or plates 27 connected thereto as by welding. A compression spring 29 is connected between each pair of actuating members 27 in a manner to bias the clamp members 25 normally closed together at their lower ends **25*a* to clamp the inner region 15 of each veneer sheet 10. In particular, each spring 29 is disposed between U-shaped flanges 27*a* attached to the actuating members 27. The flanges 27*a* are nested together and pivotally connected by a nut and bolt as shown best in FIG. 6**.

The pairs of actuating members 27 are manually moved toward one another against the bias of the compression springs 29 in order to open the lower ends **25*a* of the clamp members 25. Opening of the clamp members 25 in this manner allows insertion/removal of the inner end region 15 of the veneer sheet 10 before/after impregnation. As will be explained below, the clamping mechanism 24 is employed as fixturing means cooperable with the container 26 to appropriately suspend each veneer sheet 10 in the impregnation chamber 50** of the container for impregnation with the liquid impregnant.

Figure 5:
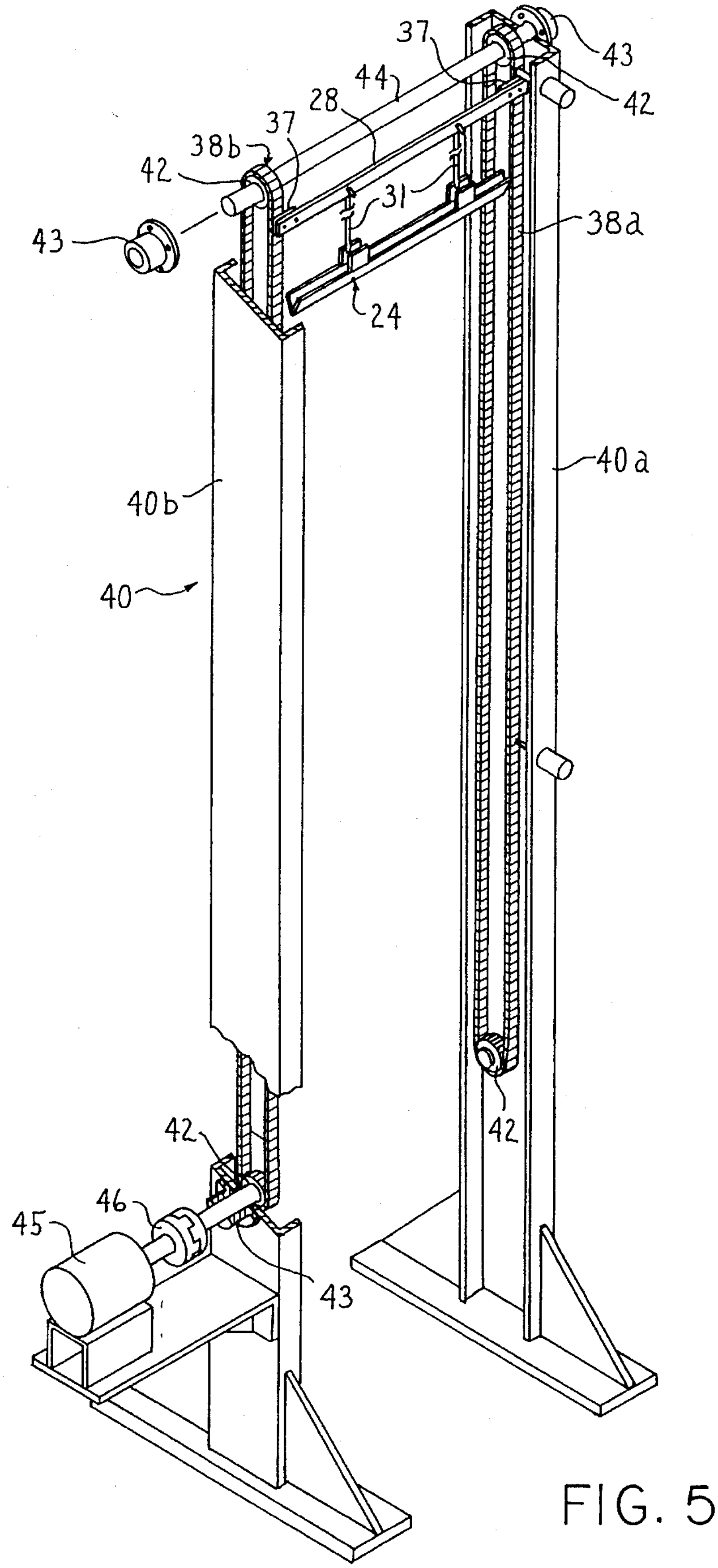
FIG. 5 is a perspective view, partially broken away, of the elevator and drive chain.
Figure 6:
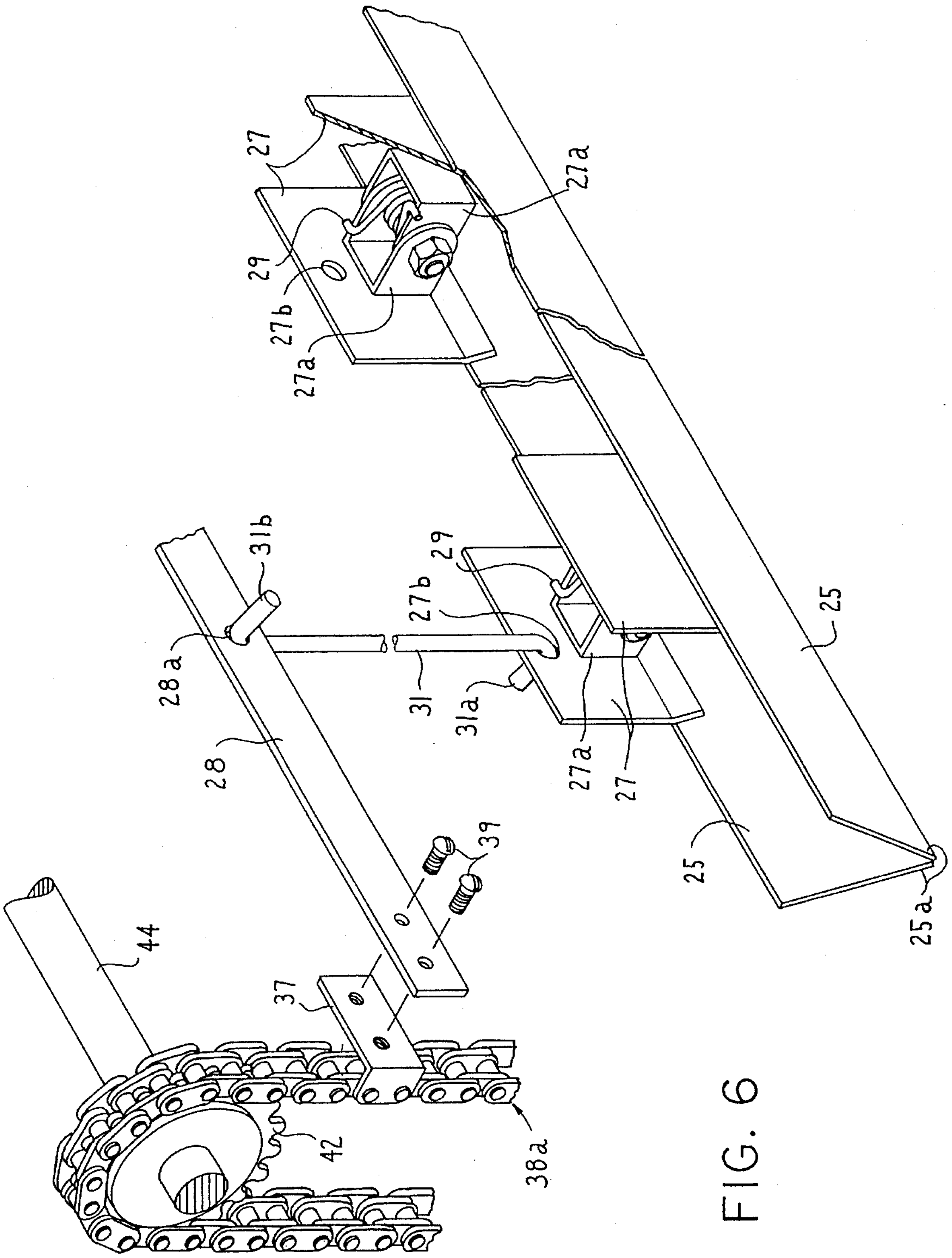
FIG. 6 is an exploded view showing connection of the clamping mechanism to the drive chain.

The clamping mechanism 24 is releasably connected by a pair of elongated links 31 to the horizontal cross-head 28 of an elevator or crane 40 as shown best in FIGS. 5 and 6. In particular, the left-hand actuating members 27 in FIG. 6 are shown including a hole 27*b* to receive the hooked end 31*a* of a respected link 31. The upper hooked ends 31*b* of the links 31 are inserted in suitable holes 28*a* in the elevator cross-head 28 such that the links are connected and pivot on the cross-head 28. The clamping mechanism 24 and cross-head 28 are thereby interconnected.

The cross-head 28 is connected at opposite ends by an L-shaped chain link 37 and link attachment screws 39 to respective endless chains 38*a*, 38*b* disposed in the upright frame posts 40*a*, 40*b* of the elevator or crane 40. Each chain 38*a*, 38*b* is mounted on upper and lower gears or sprockets 42 mounted on bearings 43. The upper sprockets 42 are interconnected by a horizontal shaft 44. One of the lower sprockets 42 is driven in rotation by an electric motor 45 (shown schematically) through a coupling 46, FIG. 5, so as to drive the chains 38*a*, 38*b* and effect rasing or lowering of the elevator cross-head 28.

The clamping mechanism 24 and veneer sheet 10 clamped thereon are lowered via the elevator cross-head 28 from the position $P_2$ in FIG. 1 toward the treatment container 26 to position the veneer sheet 10 within the impregnation chamber 50. The treatment container 26 is formed of plate members P1, P2 joined together by, for example, welding, and reinforced by flanged end beams B1 (one shown) and flanged side beams B2 welded thereto as illustrated best in FIGS. 3–4. The end beams B1 and side beams B2 are not shown in FIG. 1 for the sake of illustrating other features of the apparatus.

The clamping mechanism 24 is cooperably received in the enlarged upper chamber 51 of the container 26 to cooperate therewith in positioning of the veneer sheet 10 generally centrally in the impregnation chamber 50. In particular, the clamp members 25 include downwardly converging lower ends 25*a* that are angled to cooperably engage the converging walls 51*a* of the chamber 51 so as to suspend the veneer sheet 10 generally centrally in the impregnation chamber 50. In this way, the clamping mechanism 24 acts as fixturing means for appropriately suspending the veneer sheet 10 in the impregnation chamber 50.

Figure 3:
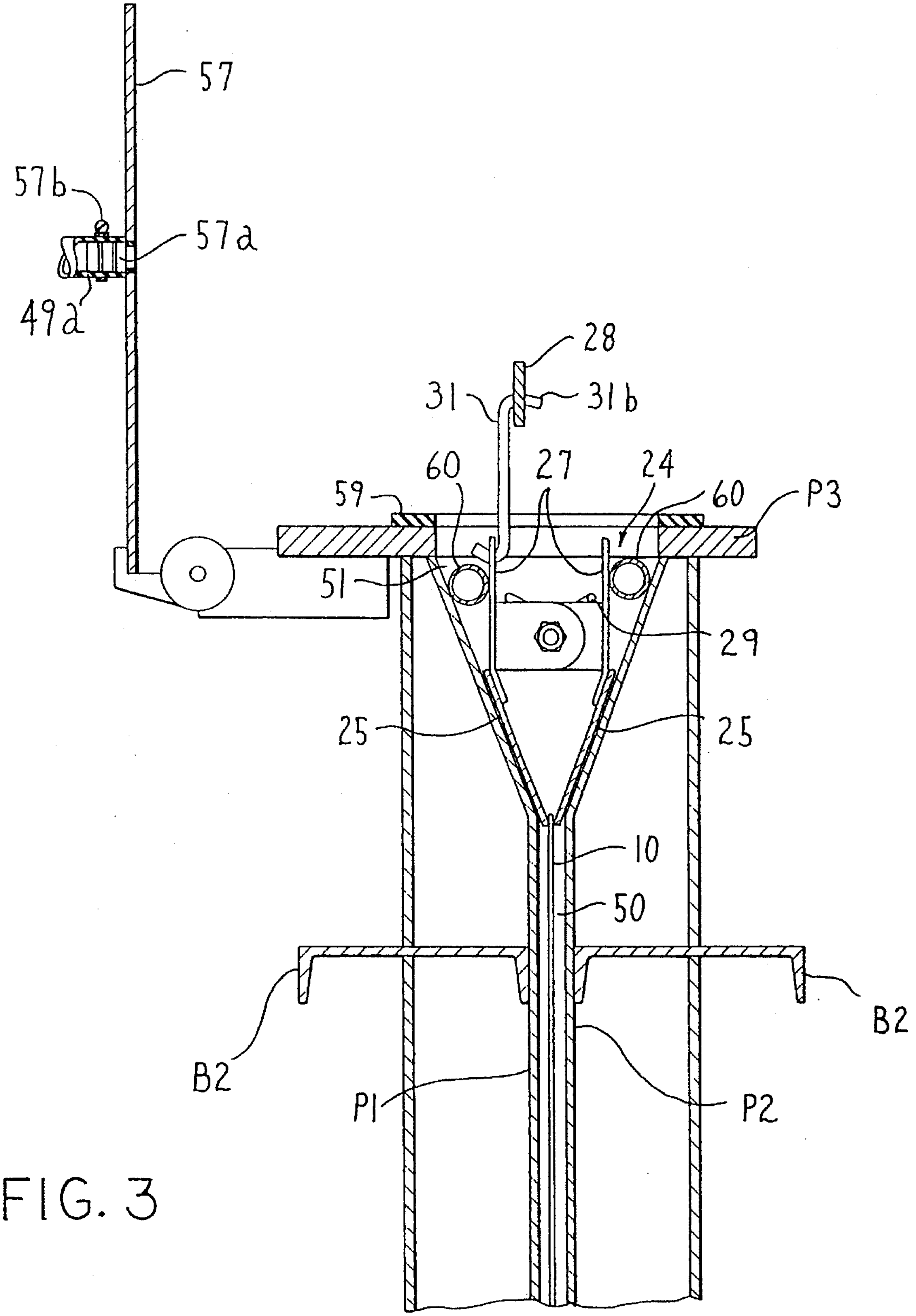
FIG. 3 is a fragmentary sectional view of the treatment container illustrating the enlarged upper chamber disposed above the impregnation chamber for cooperably receiving the clamping mechanism to hold the veneer sheet in the impregnation chamber and the wiper rollers for removing excess liquid impregnant from the veneer sheet as it is withdrawn from the impregnation chamber.

As shown in FIG. 3, a pair of elongated, parallel wiper rollers 60 are disposed in the enlarged chamber 51 adjacent each actuating member 27 of the clamping mechanism 24. The wiper rollers 60 typically comprise stainless steel pipes and are placed in the enlarged chamber 51 after the clamping mechanism 24 is positioned therein.

The impregnation chamber 50 is configured as a parallelopipedal chamber slightly enlarged relative to the wood veneer sheet 10. For example, illustrative dimensions include a chamber width of 49.5 inches, chamber height of 96.5 inches and a chamber thickness of 0.75 inch for a wood veneer sheet having dimensions of 48 inches width, 96 inches length and 0.030 inch thickness.

After the wood veneer sheet 10 is suspended in the impregnation chamber 50, the elevator links 31 are disconnected (e.g. unhooked) from the clamping mechanism 24 and raised via the elevator cross-head 28 to an upper position above the container 26 during the impregnation operation. The clamping mechanism 24 and rollers 60 remain in the upper chamber 51 during the impregnation operation.

Figure 4:
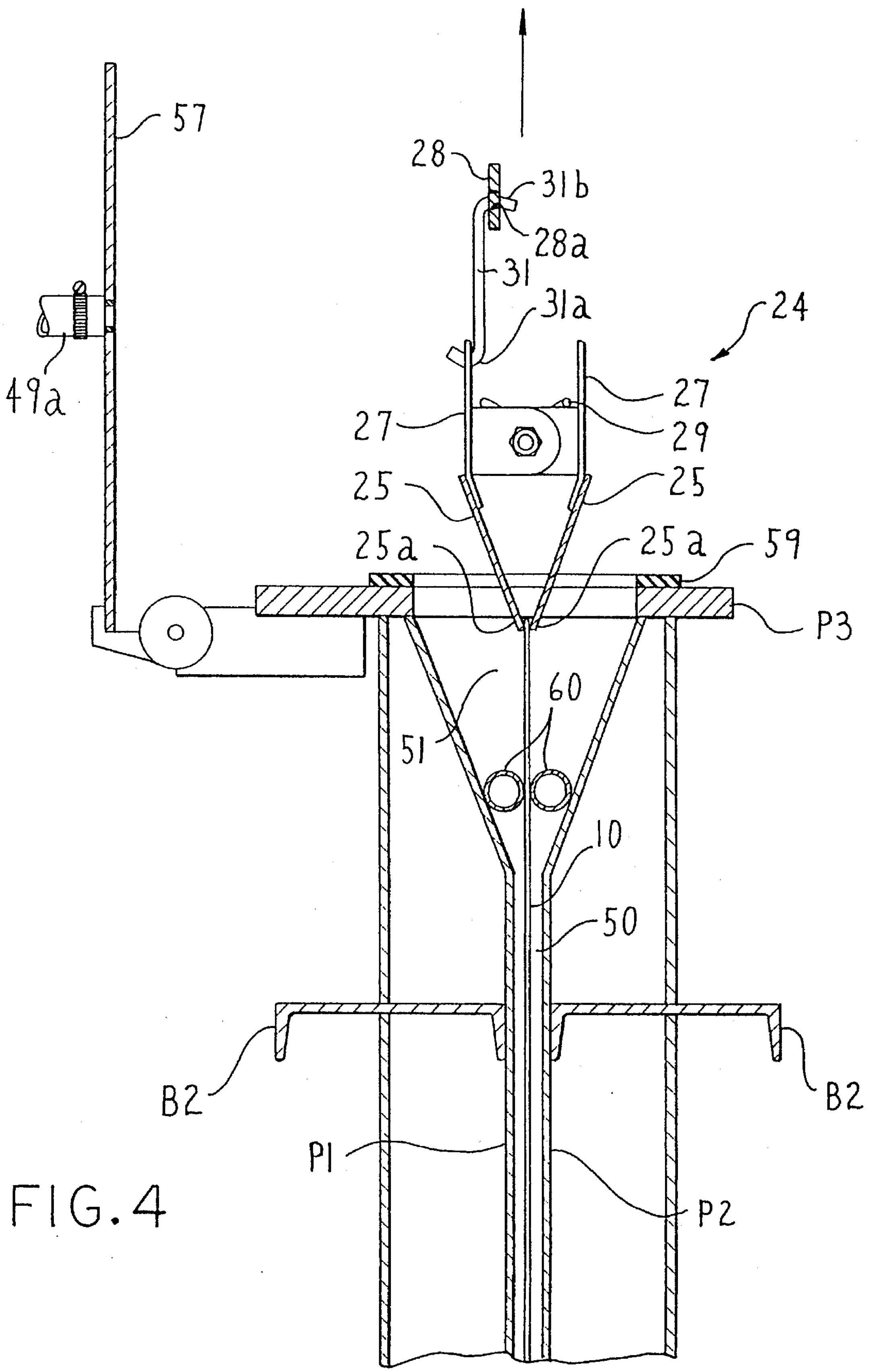
FIG. 4 is a view similar to FIG. 3 showing the clamping mechanism raised out of the treatment container so that the wiper rollers can engage the impregnated veneer sheet as it is removed from the impregnation chamber.

As shown in FIGS. 3–4, a container lid 57 is hinged on plate P3 attached on the treatment container 26 and is closeable onto an annular seal member 59 circumscribing the chamber 51 to air-tight seal the container 26. The lid 57 and plate P3 are not shown in FIG. 1 for the sake of illustrating other features of the apparatus.

The wood veneer sheet 10 residing in the treatment container 26 is subjected to an impregnation cycle which comprises an initial deaeration stage wherein the container 26 is evacuated by one or more vacuum pumps PV (one schematically shown) communicated to the impregnation chamber 50 by conduit 49*a* to remove air from the wood veneer (i.e. from the lumens, channels, vessels, and other voids in the wood veneer), and a subsequent stage wherein liquid impregnant is introduced into the evacuated treatment impregnation chamber 50 to impregnate the wood veneer sheet 10. Conduit 49*a* is connected to lid 57 so as to communicate to the chamber 50. The conduit 49*a* comprises flexible nylon reinforced vacuum hose to this end attached on a ribbed fitting 57*a* of the lid 57 by a suitable clamp 57*b*.

The liquid impregnant is transferred from a liquid impregnant storage tank T (shown schematically) into the container 26 through conduit 49*b* by pressure gradients or differentials established therebetween. Valves V1, V2, V3, V4 and V5 are actuated as appropriate to achieve evacuation of the impregnation chamber 50 and then transfer of liquid impregnant between tank T and impregnation chamber 50. In particular, the chamber 50 is initially evacuated by the vacuum pump PV with valve V2 open and the other valves V1, V3, V4 and V5 closed. Then, valves V4 and V5 are opened to communicate tank T to VENT 2 (atmospheric pressure) to effect transfer of the impregnant from tank T through conduit 49*b* to the chamber 50.

Once the liquid impregnant is introduced into the treatment container 26, the container is vented to atmospheric pressure through VENT 1 by opening valve V1 and closing the other valves V2–V5 to provide atmospheric pressure on the liquid impregnant so as to facilitate impregnation of the veneer sheet 10. After impregnation, the liquid impregnant can be transferred from the container 26 back to the tank T through conduit 49*b* with valve V1 open, by opening valves V3 and V5 with valves V2 and V4 closed. The valves V1–V6 can be actuated by a master control computer (not shown) to provide an automated impregnation cycle.

The initial vacuum level and evacuation time can be selected as needed to effect desired impregnation of the veneer sheet 10 with the liquid impregnant. Typically, each veneer sheet 10 is impregnated with the liquid impregnant uniformly across the surfaces 12 and 14 and through a substantial portion of its thickness as a result of the small sheet thickness (e.g. 0.030 inch thickness) and high wood veneer porosity.

Typically, the wood veneer sheet will absorb 50 to 70% by weight liquid impregnant based on veneer sheet weight gain. Preferably, the wood veneer sheet absorbs from 65 to 70% by weight impregnant based on sheet weight gain to provide substantially improved surface hardness in the final treated veneer sheet.

The liquid impregnant introduced into the wood veneer sheet 10 is selected effective to penetrate inwardly into the wood cells, pores, lumens, channels, vessels (wood voids) and to be polymerizable in-situ in the wood voids in a subsequent polymerizing step explained in copending application Ser. No. 08/089,707.

After the veneer sheet 10 is impregnated with the liquid impregnant, the container lid 57 is opened, and the elevator cross-head 28 is lowered so that the links 31 can be reconnected (e.g. hooked) to the actuating members 27 of the clamp mechanism 24. As the clamping mechanism 24 is raised via the cross-head 28, the wiper rollers 60 descend in the upper chamber 51 to a position shown in FIG. 4 wherein the veneer sheet 10 passes through the gap between the rollers 60 as it is withdrawn upwardly from the container 26. The rollers 60 thereby wipe or remove excess liquid impregnant from the veneer surfaces 12, 14 as the veneer sheet 10 is raised out of the container 26. In addition, the elevator cross-head 28 typically is temporarily stopped above the container 26 to suspend the impregnated veneer sheet 10 slightly above the upper chamber 51 for a time to permit any remaining excess liquid impregnant to drain by gravity from the sheet 10 down into chamber 51. Then, the elevator cross-head 28 is raised to position the impregnated veneer sheet 10 at position $P_2$ shown in FIG. 1.

At position $P_2$, the lower end of the impregnated veneer sheet 10 is maneuvered onto the upper shuttle table 32 such that lowering of the elevator or crane cross-head 28 will cause the veneer sheet 10 to slid onto the upper shuttle table 32, or onto a stack S of one or more previously impregnated veneer sheets 10 thereon, for temporary storage until each impregnated veneer sheet can be further hot pressed and laminated to a suitable substrate as explained in aforementioned copending application Ser. No. 08/089,707, the teachings of which are incorporated herein to this end. When each impregnated veneer sheet 10 is properly positioned on the table 32, the clamp members 25 are released from the impregnated veneer sheet 10 by manual actuation of the actuating members 27 toward one another so as to open the lower clamp ends 25*a* to free the veneer sheet.

The impregnation cycle described hereabove is repeated for additional untreated veneer sheets 10 temporarily stored on the lower shuttle table 22.

For purposes of illustrating, not limiting, the invention, the apparatus described can be used to impregnate a wood veneer sheet having a thickness of 0.030 inch and dimensions of 48 inches width and 96 inches length. Impregnation can be conducted in the impregnation chamber 50 at a vacuum level of about 760 millimeters (mm) of Hg for a period of 10 or less minutes. While maintaining this vacuum level, a suitable degassed liquid impregnant such as, for example, comprising 99.5 weight % EGDMA monomer and 0.5 weight % 2–2' azobis catalyst (VAZO 67) is introduced into the impregnation chamber 50 to immerse the veneer sheet 10 in the impregnant. When the veneer sheet is immersed, the vacuum is released by venting the chamber 50 to ambient atmospheric pressure as described hereabove. Each veneer sheet remains immersed in the liquid impregnant for about 3 minutes and then is removed from the impregnation chamber 50. Excess impregnant is removed from the impregnated veneer sheet 10 by the wiper rollers 60 and by drainage into upper chamber 51 as described above.

Figure 7:
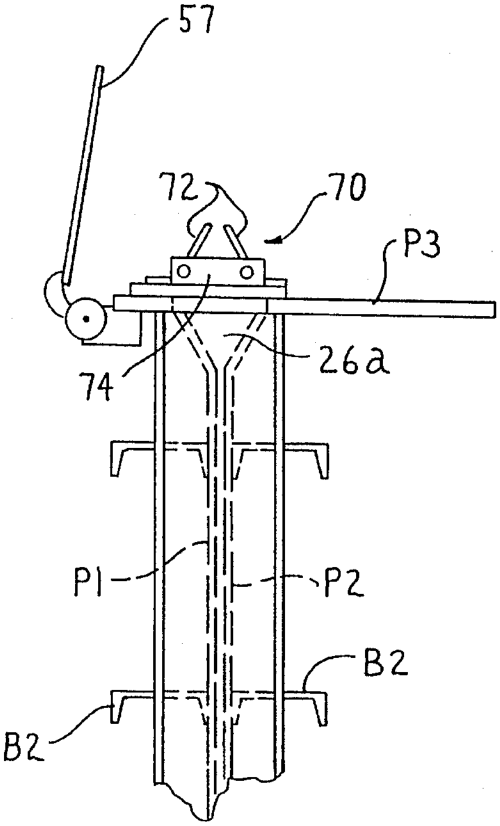
FIG. 7 is a fragmentary elevational view of another embodiment of the invention including a wiper blade assembly on top of the treatment container.

Referring to FIG. 7, apparatus in accordance with another embodiment of the invention is illustrated. This apparatus differs from that described above and shown in FIGS. 1–6 in having a wiper device 70 positioned on the plate P3 of the container 26. That is, the wiper device 70 is used in lieu of, or possibly in addition to, the wiper rollers 60 described above. In FIG. 7, like reference numerals are used to represent like features of FIGS. 1–6.

The wiper device 70 comprises opposing wiper blades 72 for wiping the opposite surfaces 12, 14 of the veneer sheet 10 as it is raised out of the container 26 via the elevator cross-head 28 as connected to the clamp members 25. The wiper blades 72 may be made of flexible material, such as rubber, to expand sufficiently to allow the clamping mechanism 24 to be raised therepast as the veneer sheet 10 is raised and then return to a closed position effective to wipe the thin veneer sheet 10 of excess liquid impregnant as it exits the container 26. Alternately, the wiper blades 72 may be spring biased to this end. The wiper device 70 can be slid on slide 74 disposed on container plate P3 into the operable wiping position shown in FIG. 6.

While the invention has been described in terms of specific embodiments thereof, it is not intended limited thereto but rather only to the extent set forth hereafter in the following claims.

The embodiments of the invention in which an exclusive property or privilege is claimed are defined as follows:

1. Apparatus for impregnating a wood veneer sheet with a liquid impregnant, comprising:

a container having an upper chamber communicated to an upper end of a vertically elongated lower impregnation chamber adapted to receive a wood veneer sheet, a clamping mechanism for releasably engaging only a peripheral region of the veneer sheet, said clamping mechanism being adapted to be cooperably received in said upper chamber with the veneer sheet suspended downwardly therefrom into said impregnation chamber, an elevator releasably connectable to said clamping mechanism for holding the sheet in a downwardly suspended state and for lowering the clamping mechanism into said upper chamber to suspend the veneer sheet in said impregnation chamber, said elevator mechanism being disconnected from said clamping mechanism such that said clamping mechanism remains in said upper chamber during impregnation of the veneer sheet, means for evacuating said impregnation chamber after the veneer sheet is suspended therein, means for introducing liquid impregnant into said impregnation chamber about the veneer sheet suspended therein, means for establishing a pressure in said impregnation chamber effective to impregnate the veneer sheet suspended therein with the liquid impregnant, said clamping mechanism being reconnectable to said elevator after the veneer sheet is impregnated so as to enable upward removal of the veneer sheet from said container;

sheet wiping means disposed above said impregnation chamber to wipe off excess liquid impregnant from the sheet as the impregnated veneer sheet is upwardly removed from said impregnation chamber.

2. The apparatus of claim 1 further comprising a closure member that is openable to permit positioning of said fixturing means in said container and closeable for airtight sealing the impregnation chamber prior to evacuation thereof.

3. The apparatus of claim 1 wherein said upper chamber and said clamping mechanism cooperably and supportingly engage for positioning the veneer sheet in said impregnation chamber.

4. The apparatus of claim 1 wherein said means for establishing a pressure in the impregnation chamber comprises a venting valve for venting said impregnation chamber to ambient atmosphere after the liquid impregnant is introduced therein.

5. The apparatus of claim 1 wherein said wiping means comprises a pair of wiping elements disposed adjacent said upper chamber and positioned for engaging opposite faces of the sheet as it is upwardly removed.

6. The apparatus of claim 1 wherein the impregnation chamber is configured as a parallelopipedal chamber to receive the veneer sheet, said impregnation chamber having a width which is substantially greater than the thickness.

7. The apparatus of claim 6 wherein said upper chamber is of a generally upwardly-opening V-shaped configuration defined by two opposed side walls which converge with respect to one another as they project downwardly and wherein a bottom of the upper chamber opens into an upper end of the impregnation chamber.

8. The apparatus of claim 7 wherein the clamping mechanism includes a V-shaped fixturing part which is movable inwardly into said upper chamber, the fixturing part having a first portion which is supportingly engaged with the side walls defining the upper chamber to stationarily support the fixturing part, and a second portion which includes at least portions of clamping members movably carried by the first portion for releasable clamping engagement with an upper peripheral end portion of the veneer sheet when the sheet is suspended in the impregnation chamber.

9. The apparatus of claim 8 including a movable closure member for mounting on and closing off the upper end of the upper chamber when the clamping mechanism is disposed therein and is disconnected from the elevator.

10. The apparatus of claim 1 including a lower support table disposed adjacent the elevator for permitting a vertical stack of veneer sheets to be supported thereon with the sheets oriented horizontally so that one peripheral edge of each sheet is disposed adjacent the elevator, and an upper support table disposed adjacent the elevator and defining thereon a horizontally enlarged support for permitting the veneer sheet when upwardly removed from the impregnation chamber to be lowered and horizontally deposited on the upper table.

* * * * *